United States Patent [19]

Mellot

[11] Patent Number: 6,114,904
[45] Date of Patent: Sep. 5, 2000

[54] FAST AMPLIFIER OUTPUT STAGE

[75] Inventor: Pascal Mellot, Lans en Vercors, France

[73] Assignee: SGS-Thomson Microelectronics S.A., Gentilly, France

[21] Appl. No.: 08/958,103

[22] Filed: Oct. 27, 1997

[51] Int. Cl.[7] .................................................. H03F 3/45
[52] U.S. Cl. .................................... 330/252; 330/257
[58] Field of Search .................................. 330/252, 257, 330/260, 261, 85, 311, 310

[56] References Cited

U.S. PATENT DOCUMENTS

| | | | |
|---|---|---|---|
| 4,042,886 | 8/1977 | Hanna | 330/260 |
| 4,122,401 | 10/1978 | Sauer | 330/257 |
| 4,306,198 | 12/1981 | Okada | 330/260 |
| 4,338,527 | 7/1982 | Nagano | 330/257 |
| 4,543,538 | 9/1985 | Fay | 330/260 |
| 5,117,200 | 5/1992 | Scott, III | 330/85 |

*Primary Examiner*—Robert Pascal
*Assistant Examiner*—Khanh Van Nguyen
*Attorney, Agent, or Firm*—Wolf, Greenfield & Sacks, P.C.; James H. Morris; Theodore E. Galanthay

[57] ABSTRACT

An amplifier output stage comprises an output transistor having a control terminal coupled to a first supply rail through a controllable current source, and a main terminal connected to an output terminal of the output stage; and an auxiliary differential stage operatively connected to compare the voltage on the output terminal to a reference voltage and to pull the control terminal of the output transistor towards a second supply rail when the voltage on the output terminal reaches the reference voltage.

28 Claims, 2 Drawing Sheets

FAST AMPLIFIER OUTPUT STAGE

FIELD OF THE INVENTION

The present invention relates to an operational amplifier and more particularly to an output stage of such an amplifier.

DISCUSSION OF THE RELATED ART

FIG. 1 schematically shows the structure of a widely used operational amplifier. This amplifier comprises a differential input stage including a pair of NPN transistors Q1 and Q2. The emitters of transistors Q1 and Q2 are connected to a low supply rail GND through a same current source 10. The collector of transistor Q1 is connected to the collector of an input transistor Q3 of a current mirror. This current mirror includes transistor Q3 and an output transistor Q4 whose collector is connected to the collector of transistor Q2. Transistors Q3 and Q4 are PNP transistors. The emitters are connected to a high supply rail Vcc and their bases are connected together and to the collector of transistor Q3.

The output stage of the amplifier includes an NPN transistor Q5 whose base is connected to the collector of transistor Q4. The collector of transistor Q5 is connected to the high supply rail Vcc and its emitter, constituting the output terminal of the amplifier, is connected to the low supply rail GND through a current source 12.

The base of transistor Q1 constitutes the non-inverting input of the amplifier, while the base of transistor Q2 constitutes the inverting input. In many applications, this inverting input is connected, as shown, to the output terminal and to half the supply voltage Vcc/2 through respective resistors 14 and 15. The gain of the amplifier is then positive and determined by the values of resistors 14 and 15.

The amplifier of FIG. 1 has the advantage of being simple and fast. It is often used to amplify a pixel color signal which evolves by steps at the rate of a pixel clock.

FIG. 2 shows an exemplary evolution of a pixel input signal Vin provided to the base of transistor Q1 and of the corresponding output Vout of the amplifier. FIG. 2 moreover illustrates a drawback of the amplifier of FIG. 1.

When voltage Vin increases, transistor Q1 becomes more conductive and pulls more current from transistor Q3. Transistor Q4 tends to provide on its collector the current pulled from transistor Q3, and thus also becomes more conductive and provides more drive to transistor Q5. The output voltage Vout then rises.

If voltage Vin rises high enough, voltage Vout is clipped at a maximum voltage equal to Vcc—$Vce_{sat}$—Vbe, where $Vce_{sat}$ is the collector-emitter saturation voltage of transistor Q4 and Vbe the base-emitter voltage of transistor Q5. This condition is shown in FIG. 2, where the expected evolution of voltage Vout is shown in dotted lines and the real evolution is shown in full lines.

A bipolar transistor thus driven into saturation mode needs a long time to recover. This also appears in FIG. 2, where the real falling edge of signal Vout following a saturation of transistor Q4 occurs substantially later than the expected falling edge shown in dotted lines. In an application to pixel signals, the pixel following the one having caused a saturation will have a wrong value.

Although automatic gain control is often used in the amplification of pixel signals, the saturation conditions are not always avoided, because the automatic gain control reacts to the mean value of the signal and not to high instantaneous values of the signal which do not affect the mean value.

SUMMARY OF THE INVENTION

An object of the invention is to provide an amplifier output stage which has no speed limitations due to a saturation of a transistor.

To achieve these objects, the present invention provides an amplifier output stage comprising an output transistor having a control terminal coupled to a first supply rail through a controllable current source, and a main terminal connected to an output terminal of the output stage; and an auxiliary differential stage operatively connected to compare the voltage on the output terminal to a reference voltage and to pull the control terminal of the output transistor towards a second supply rail when the voltage on the output terminal reaches the reference voltage.

According to an embodiment of the invention, the differential stage comprises first and second differentially connected transistors respectively controlled by the reference voltage and the voltage on the output terminal, wherein the second transistor is connected to the control terminal of the output transistor.

According to an embodiment of the invention, the output voltage is provided to the auxiliary differential stage by a transistor having its control terminal connected to the control terminal of the output transistor.

According to an embodiment of the invention, the controllable current source is comprised of an output stage of a current mirror connected in output branches of a differential input stage.

According to an embodiment of the invention, the reference voltage is slightly below the maximum value reachable by the voltage on the output terminal.

The foregoing and other objects, features, aspects and advantages of the invention will become apparent from the following detailed description of embodiments, given by way of illustration and not of limitation with reference to the accompanying drawings.

DESCRIPTION OF THE PREFERRED EMBODIMENTS

Figure 1:
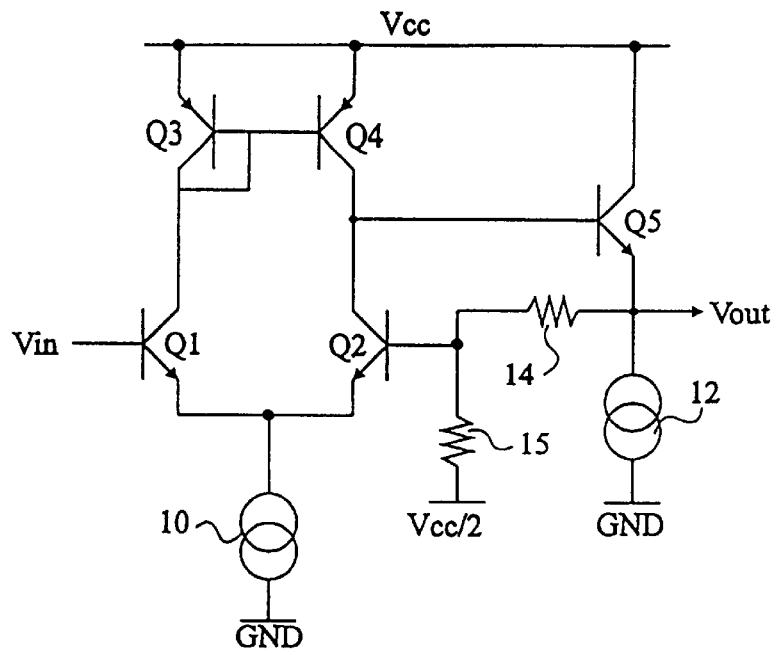
FIG. 1, previously described, is a diagram of a conventional operational amplifier.
Figure 2:
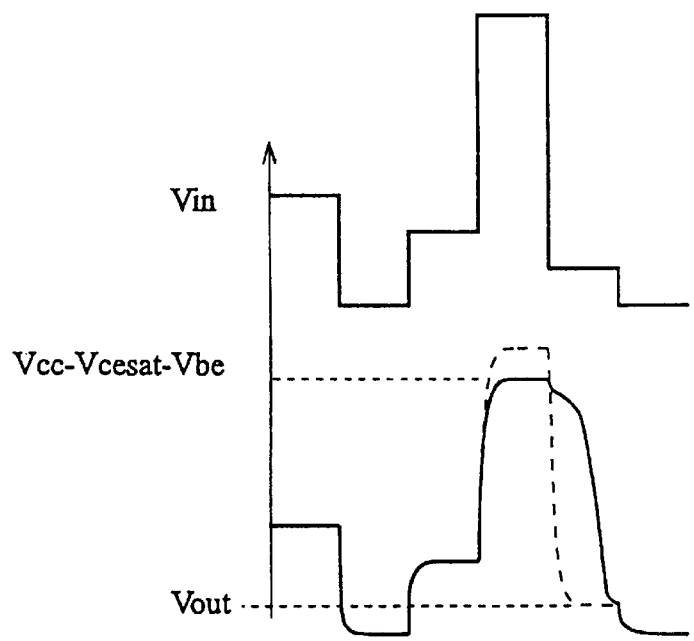
FIG. 2 illustrates input and output waveforms in the amplifier of FIG. 1.
Figure 3:
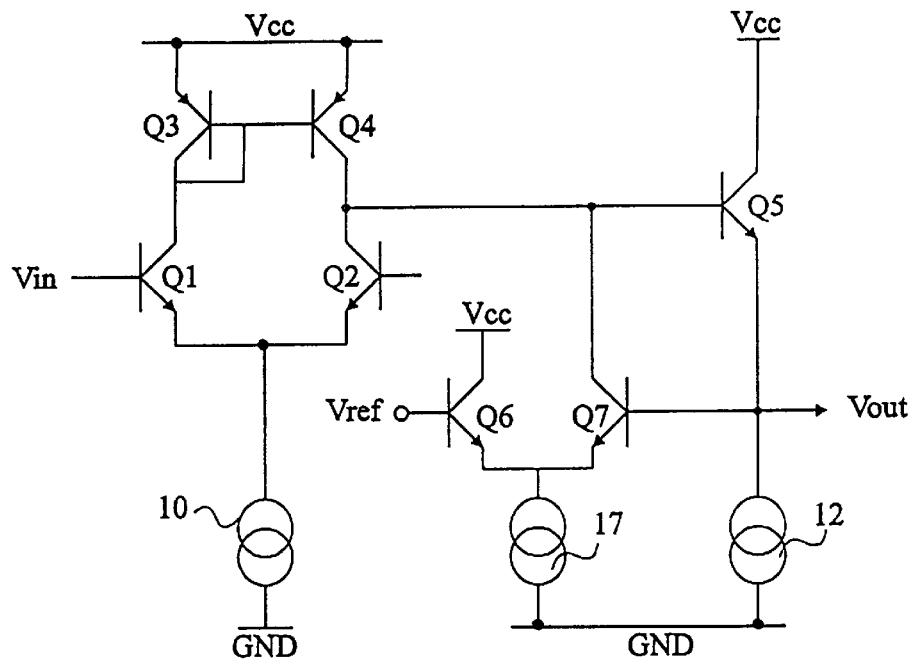
FIG. 3 shows the amplifier of FIG. 1 with a first embodiment of a saturation canceling circuit according to the invention.

FIG. 3 shows the amplifier of FIG. 1, having same elements designated with same referenced characters. This amplifier further includes, according to the invention, a saturation canceling circuit intended to avoid saturation of transistor Q4. This circuit comprises two NPN transistors Q6 and Q7 connected in a differential stage. The emitters of transistors Q6 and Q7 are connected to low supply rail GND through a same current source 17. The collectors of transistors Q6 and Q7 are respectively connected to the high supply rail Vcc and to the base of output transistor Q5. The base of transistor Q7 is connected to the output terminal of the amplifier, i.e. to the emitter of transistor Q5, whereas the base of transistor Q6 receives a constant reference voltage Vref. Voltage Vref is chosen slightly below the maximum value reachable by the output voltage Vout. In other words, voltage Vref is smaller than $Vcc - Vce_{sat} - Vbe$.

This arrangement operates as a comparator. When voltage Vout is below voltage Vref, transistor Q7 is off and does not affect the normal operation of the amplifier, whereas transistor Q6 is on and derives all the current of source 17. When voltage Vout exceeds voltage Vref, transistor Q7 is on and pulls down the base of transistor Q5 towards the low supply rail GND through current source 17. As a consequence, transistor Q5 becomes less conductive and voltage Vout tends to drop. A stable condition is reached when voltage Vout is equal to voltage Vref, provided that current source 17 is capable of pulling all the current from transistor Q4. For this purpose, the current of source 17 is equal to, or greater than, the current of source 10.

Voltage Vref thus sets the maximum value of voltage Vout. By choosing voltage Vref slightly below $Vcc - Vce_{sat} - Vbe$, the collector-emitter voltage of transistor Q4 will always be slightly above the saturation value $Vce_{sat}$, whereby transistor Q4 does not saturate and maintains its fast operating speed no matter how high the input voltage Vin is. Voltage Vref may be provided by two diodes (not shown) connected in series to supply rail Vcc.

Figure 4:
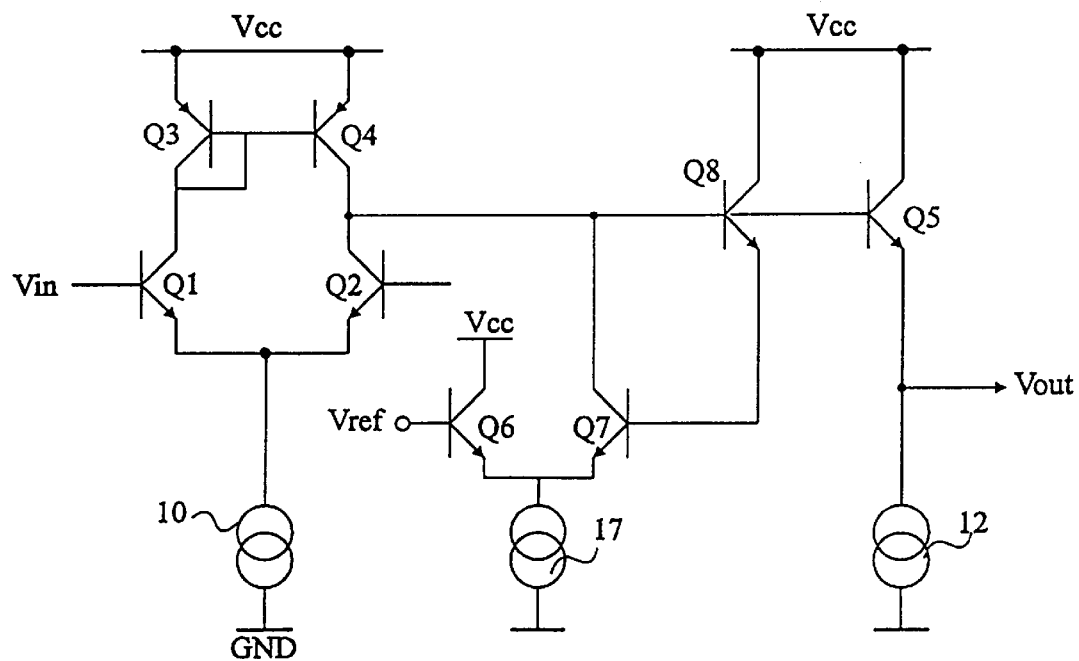
FIG. 4 shows the amplifier of FIG. 1 with a second embodiment of a saturation canceling circuit according to the invention.

FIG. 4 shows another embodiment of a saturation canceling circuit according to the invention. This circuit is similar to that of FIG. 3, except that the base of transistor Q7, instead of being connected to the emitter of the output transistor Q5, is connected to the emitter of an additional NPN transistor Q8 which is connected in parallel with transistor Q5, by its base and collector. The Vbe voltages of transistors Q5 and Q8 are preferably matched.

The advantage of this arrangement with respect to that of FIG. 3 is that transistor Q8 always has a fast operation, protecting transistor Q4 from being saturated no matter how slow transistor Q5 reacts, for example due to a highly capacitive load connected to the output of the amplifier.

The invention has been described in connection with a particular type of amplifier. However, the invention applies to any type of amplifier in which an output transistor is driven from a supply rail by a saturable current source.

Such alterations, modifications, and improvements are intended to be within the spirit and scope of the invention. Accordingly, the foregoing description is by way of example only and is not intended to be limiting. The invention is limited only as defined in the following claims and the equivalents thereto.

What is claimed is:

1. An amplifier output stage comprising:
   an output transistor having a control terminal coupled to a first supply rail through a controllable current source, and a main terminal connected to an output terminal of the output stage; and
   an auxiliary differential stage operatively connected to compare the voltage on the output terminal to a reference voltage and to pull the control terminal of the output transistor towards a second supply rail when the voltage on the output terminal exceeds the reference voltage;
   wherein said controllable current source is comprised of an output stage of a current mirror connected in output branches of a differential input stage.

2. The amplifier output stage of claim 1, wherein the differential stage comprises first and second differentially connected transistors respectively controlled by the reference voltage and the voltage on the output terminal, wherein the second transistor is connected to the control terminal of the output transistor.

3. The amplifier stage of claim 1, wherein a transistor having its control terminal connected to the control terminal of the output transistor is selected such that the output voltage is provided to the auxiliary differential stage.

4. The amplifier output stage of claim 1, wherein said reference voltage is slightly below the maximum value reachable by the voltage on the output terminal.

5. An amplifier output stage comprising:
   an output transistor having a control terminal coupled to a first supply rail through a controllable current source, and a main terminal connected to an output terminal of the output stage;
   a second transistor controlled by the voltage on the output terminal and having a first main terminal connected to the control terminal of the output transistor and a second main terminal coupled to a second supply rail through a second current source; and
   a third transistor controlled by a reference voltage and having a first main terminal coupled to the first supply rail and a second main terminal connected to the second main terminal of the second transistor;
   wherein said controllable current source is comprised of an output stage of a current mirror connected in output branches of a differential input stage.

6. The amplifier stage of claim 5, wherein a transistor having its control terminal connected to the control terminal of the output transistor is selected such that the output voltage is provided to the auxiliary differential stage.

7. The amplifier output stage of claim 5, wherein said reference voltage is slightly below the maximum value reachable by the voltage on the output terminal.

8. An amplifier comprising:
   a differential input stage having an output terminal and including at least one transistor, the saturation of which is to be avoided; and
   an output stage connected from the output terminal of the differential input stage and having an output terminal defining the output of the amplifier;
   said output stage comprising at least an auxiliary differential stage operatively connected to compare the voltage on the output terminal of the output stage to a reference voltage and to thus control the current through said at least one transistor to avoid saturation thereof;
   wherein said output stage includes an output transistor having a control terminal coupled to a first supply rail through a controllable current source, and a main terminal connect to the output terminal of the output stage.

9. The amplifier of claim 8, wherein the auxiliary differential stage is adapted to pull the control terminal of an output transistor towards a second supply rail when the voltage on the output terminal exceeds the reference voltage.

10. The amplifier of claim 8, wherein the auxiliary differential stage comprises first and second differentially connected transistors respectively controlled by the reference voltage and the voltage on the output terminal of the output stage.

11. The amplifier of claim 9, wherein the auxiliary differential stage comprises first and second differentially connected transistors respectively controlled by the reference voltage and the voltage on the output terminal of the output stage and wherein the second transistor of the differentially controlled transistors is connected to the control terminal of the output transistor.

12. The amplifier of claim 9, wherein the output voltage is provided to the auxiliary differential stage by an intermediate transistor having its control terminal connected to the control terminal of the output transistor.

13. The amplifier of claim 9, wherein said controllable current source is comprised of an output stage of a current mirror connected in output branches of the differential input stage.

14. The amplifier of claim 9, wherein said reference voltage is slightly below the maximum value reachable by the voltage on the output terminal of the output stage.

15. The amplifier of claim 8, wherein said auxiliary differential stage comprises a pair of light conductivity transistors having their emitters commonly connected to a current source.

16. The amplifier of claim 15, wherein said output stage further includes an output transistor having a control terminal coupled to a first supply rail through a controllable current source, and a main terminal connected to an output terminal of the output stage, the control terminal of said output transistor also connecting to a main terminal of one of a pair of transistors comprising the auxiliary differential stage.

17. The amplifier of claim 16, further including a second current source connected to the output terminal of the output stage of the amplifier.

18. The amplifier of claim 17, further including an intermediate transistor connected between said output transistor and said first transistor of said auxiliary differential stage.

19. An amplifier comprising:

a differential input stage having an output terminal; and an output stage connected from the output terminal of the differential input stage and having an output terminal defining the output of the differential stage and having an output terminal defining the output of the amplifier;

said output stage comprising;

a first transistor having a control terminal coupled to a first supply rail through a controllable current source, and a main terminal connected to an output terminal of the output stage, a second transistor controlled by the voltage on the output terminal and having a main terminal connected to the control terminal of the output transistor and a second main terminal coupled to a second supply rail, and a third transistor controlled by a reference voltage and having a first main terminal coupled to the first supply rail and a second main terminal connected to the second main terminal of the second transistor.

20. The amplifier of claim 19, wherein said first transistor has its control terminal coupled to the first supply rail through a controllable current source.

21. The amplifier of claim 20, wherein said second transistor has its second main terminal coupled to the second supply rail through a second current source.

22. The amplifier of claim 21, wherein the output voltage is provided to the second transistor by fourth transistor having a control terminal connected to the control terminal of the first transistor.

23. The amplifier of claim 21, wherein said controllable current source is comprised of an output stage of a current mirror connected in output branches of the differential input stage.

24. The amplifier of claim 21, wherein said reference voltage is slightly below the maximum value reached by the voltage on the output terminal of the output stage.

25. An amplifier output stage comprising:

an output transistor means having a control terminal coupled to a first supply rail through a controllable current source means, and a main terminal connected to an output terminal of the output stage; and an auxiliary differential stage means operatively connected to compare the voltage on the output terminal to a reference voltage and to pull the control terminal of the output transistor means towards a second supply rail when the voltage on the output terminal exceeds the reference voltage, wherein said controllable current source means is comprised of an output stage of a current mirror means connected in output branches of a differential input stage means.

26. The amplifier of claim 25, wherein the differential stage means comprises first and second differentially connected transistor means respectively controlled by the reference voltage and the voltage on the output terminal, wherein the second transistor means is connected to the control terminal of the output transistor means.

27. The amplifier stage of claim 25, wherein a transistor having its control terminal connected to the control terminal of the output transistor is selected such that the output voltage is provided to the auxiliary differential stage.

28. The amplifier of claim 25, wherein said reference voltage is slightly below the maximum value reachable by the voltage on the output terminal.

* * * * *